US008017413B2

(12) United States Patent
Lee et al.

(10) Patent No.: US 8,017,413 B2
(45) Date of Patent: Sep. 13, 2011

(54) FIELD EMISSION ARRAY HAVING CARBON MICROSTRUCTURE AND METHOD OF MANUFACTURING THE SAME

(75) Inventors: Seung Seob Lee, Daejeon (KR); Seok Woo Lee, Gongju-si (KR); Jung A Lee, Daejeon (KR)

(73) Assignee: Korea Advanced Institute of Science and Technology, Yuseong-gu, Daejeon (KR)

( * ) Notice: Subject to any disclaimer, the term of this patent is extended or adjusted under 35 U.S.C. 154(b) by 61 days.

(21) Appl. No.: 12/450,965

(22) PCT Filed: Jul. 1, 2008

(86) PCT No.: PCT/KR2008/003874

§ 371 (c)(1), (2), (4) Date: Oct. 20, 2009

(87) PCT Pub. No.: WO2010/002046

PCT Pub. Date: Jan. 7, 2010

(65) Prior Publication Data

US 2011/0089396 A1 Apr. 21, 2011

(30) Foreign Application Priority Data

Jun. 30, 2008 (KR) ........................ 10-2008-0062548

(51) Int. Cl.
*H01L 21/00* (2006.01)

(52) U.S. Cl. .............. 438/20; 438/34; 438/795; 257/10; 257/E51.04

(58) Field of Classification Search .................... 438/20, 438/34, 795; 257/10, E51.04
See application file for complete search history.

(56) References Cited

U.S. PATENT DOCUMENTS 7,563,148 B2 * 7/2009 Wei et al. ........................ 445/24

OTHER PUBLICATIONS

Lee, Seok Woo, et al., "Application of Huygens-Fresnel diffraction principle for high aspect ratio SU-8 micro- / nanotip array", *Optics Letters*, vol. 33, No. 1, pp. 40-42, (Jan. 1, 2008).

Lee. Seok Woo, et al. "Vertically aligned carbon nanowires (CNWs): Top-down approach using photolithography and pyrolysis", Nanotechnology Conference and Trade Show-Nanotech 2008, Nano Science and Technology Institute, 9 pages, Jun. 1-5, 2008.

* cited by examiner

*Primary Examiner* — Tu-Tu V Ho

(74) *Attorney, Agent, or Firm* — The Nath Law Group; Jerald L. Meyer; Sungyeop Chung

(57) ABSTRACT

Provided is a method for manufacturing a field emission array with a carbon microstructure. The method includes: a photomask attachment step of attaching a photomask with a pattern groove to one surface of a transparent substrate; a photoresist attachment step of attaching a negative photoresist to one surface of the photomask; an exposure step of irradiating light toward the opposite surface of the transparent substrate from the photomask to cure a portion of the negative photoresist with the light irradiated on the negative photoresist through the pattern groove; a developing step of removing an uncured portion of the negative photoresist while leaving the cured portion of the negative photoresist as a microstructure; a pyrolysis step of heating and carbonizing the microstructure thus obtained; and a cathode attachment step of attaching a voltage-supplying cathode to the surface of the transparent substrate on which the microstructure is formed.

18 Claims, 9 Drawing Sheets

【Figure 1】
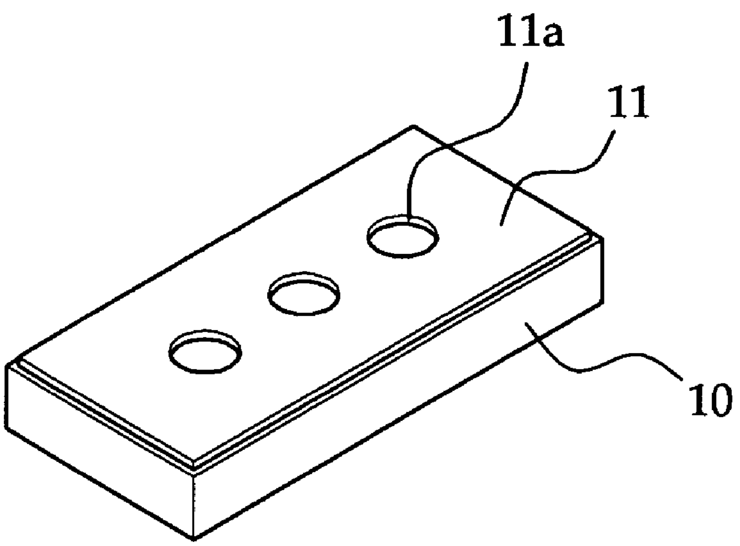
【Figure 2】
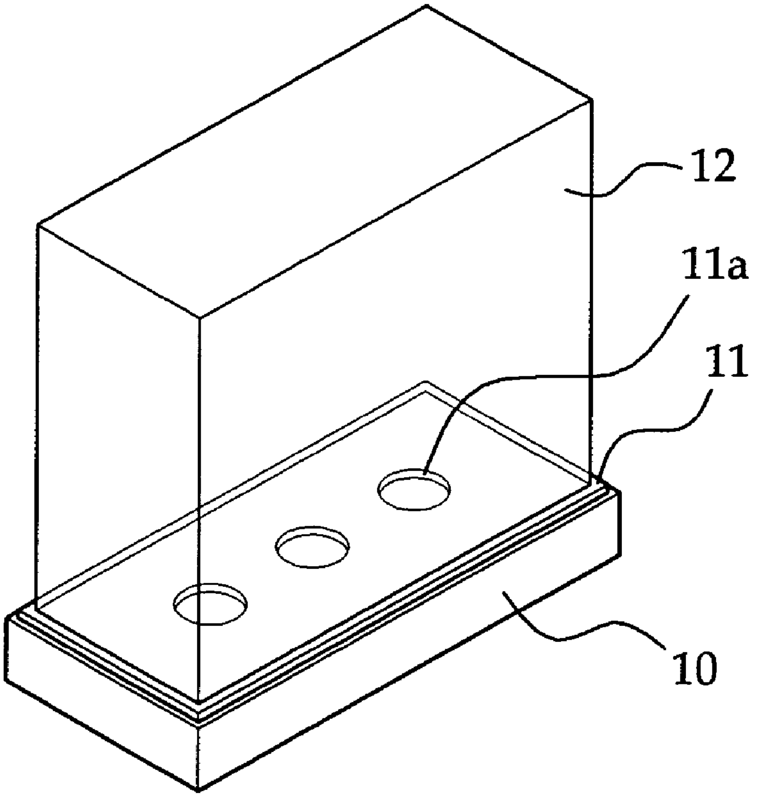

【Figure 3】
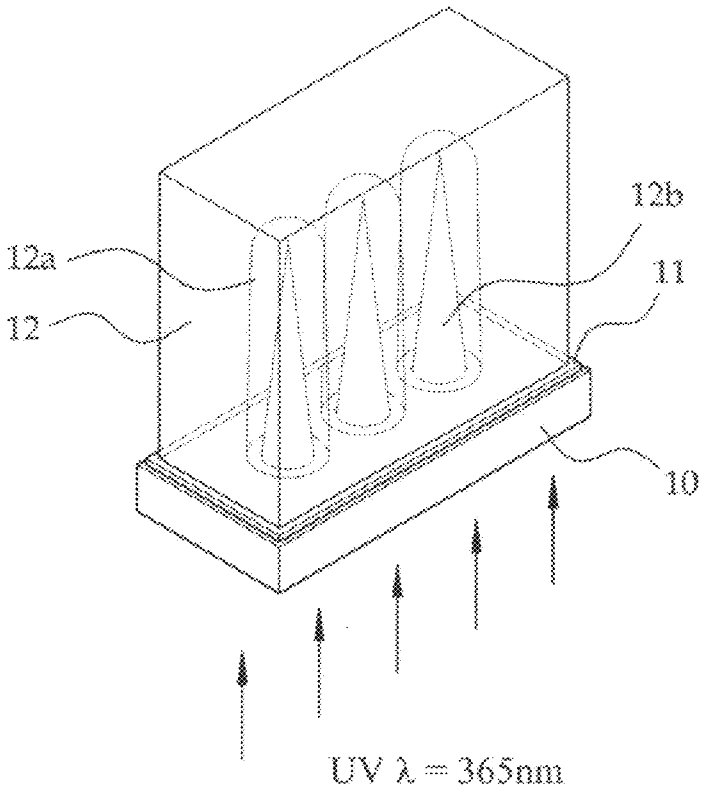
【Figure 4】
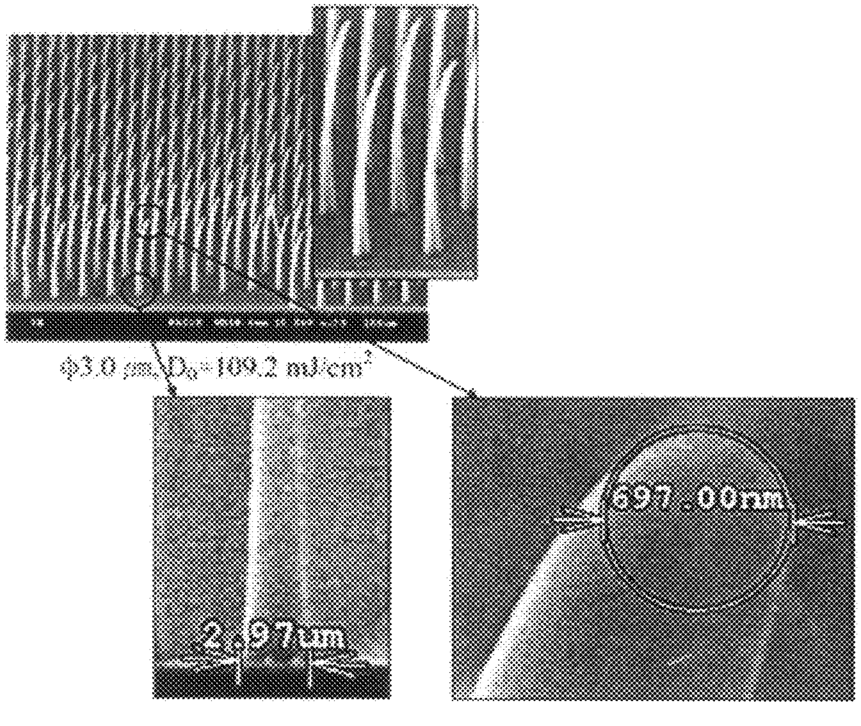

【Figure 5】
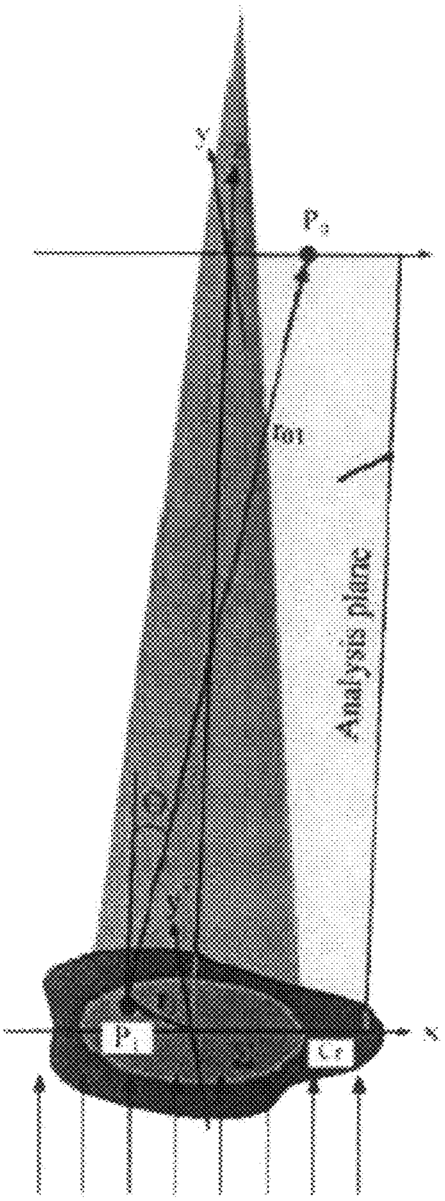
【Figure 6】
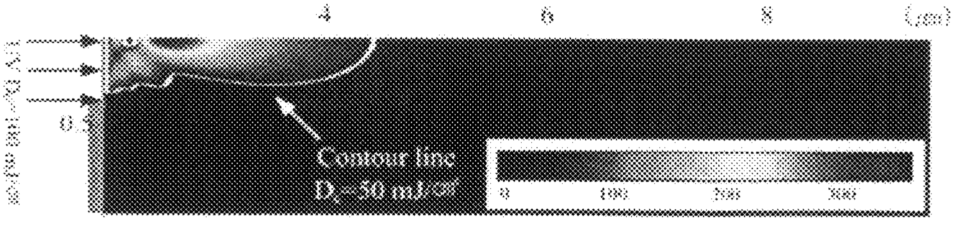

【Figure 7】
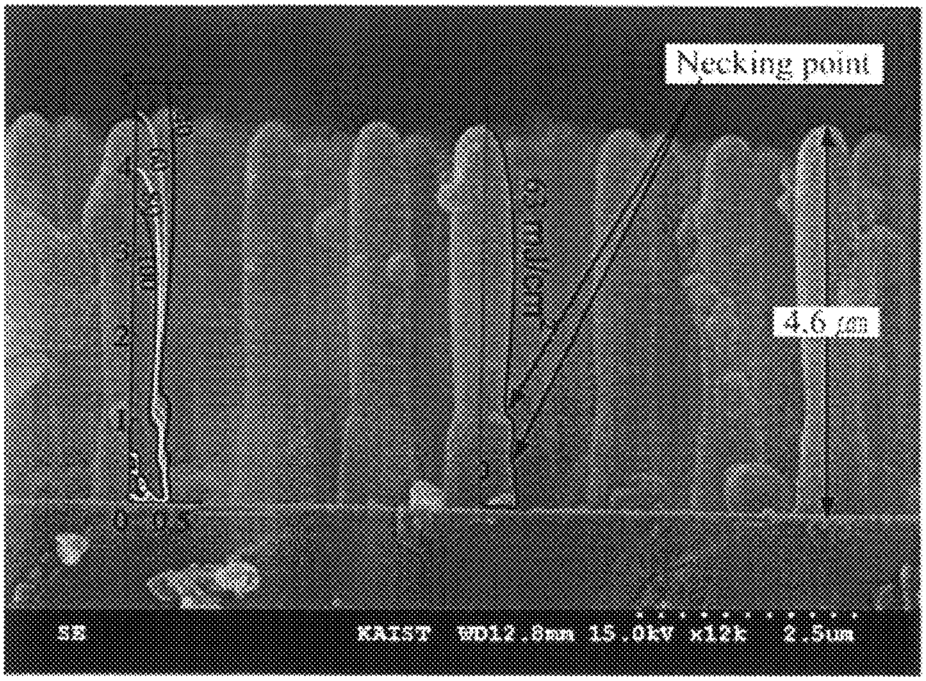
$\phi$1.0 μm, $D_0$=109.2 mJ/cm$^2$
【Figure 8】
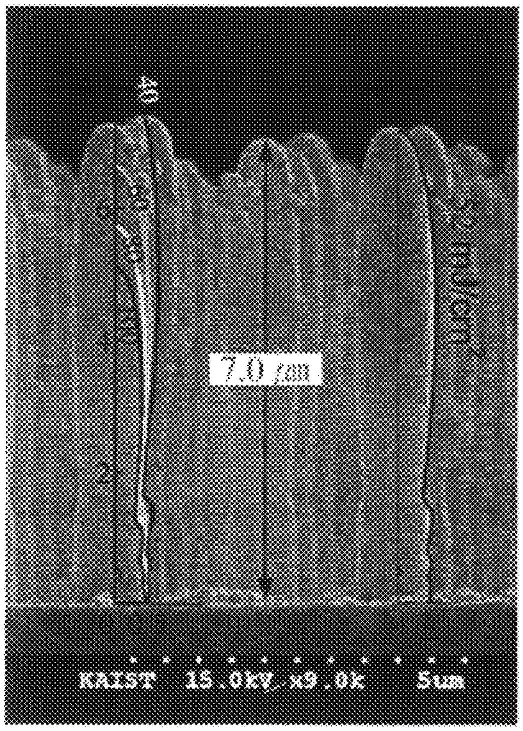
$\phi$1.0 μm, $D_0$=218.4 mJ/cm$^2$ 【Figure 9】
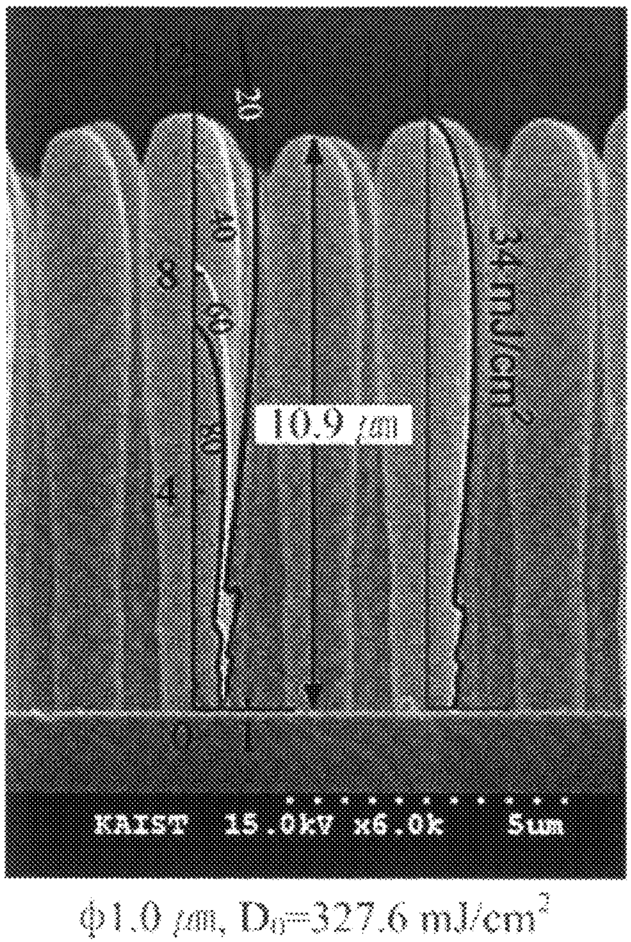
ϕ1.0 ㎛, $D_0$=327.6 mJ/cm²
【Figure 10】
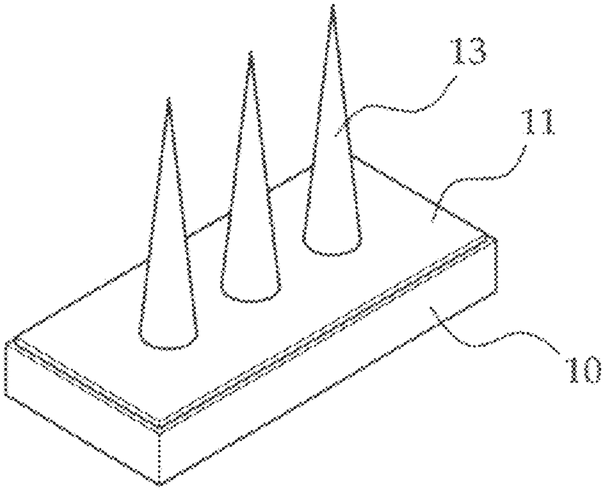

【Figure 11】
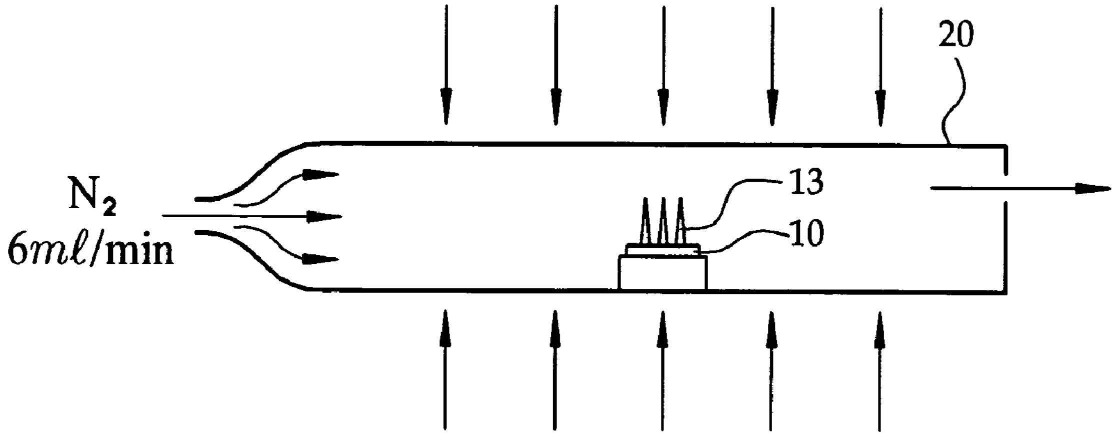
【Figure 12】
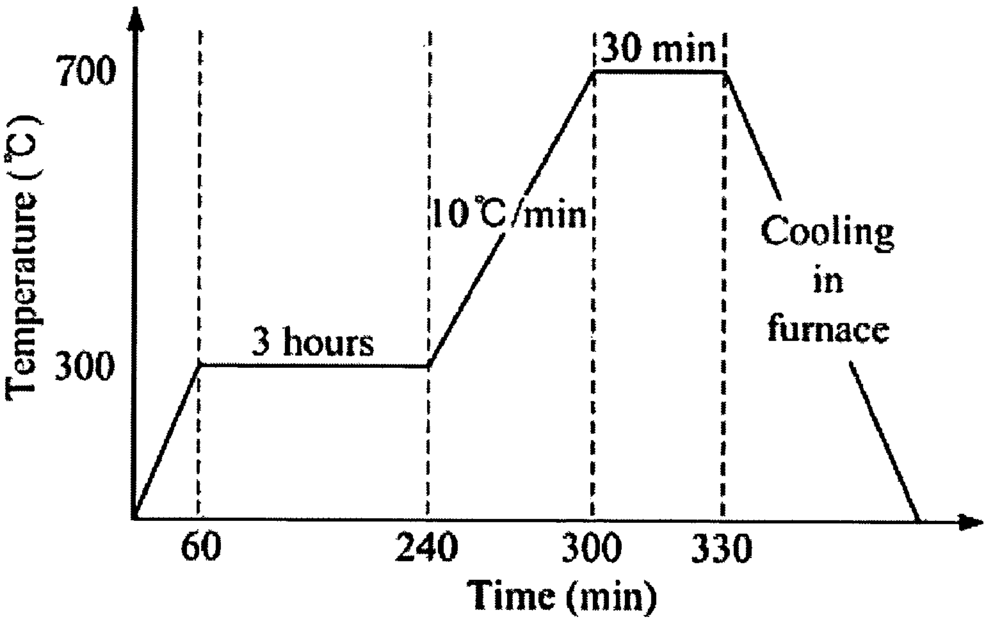

【Figure 13】
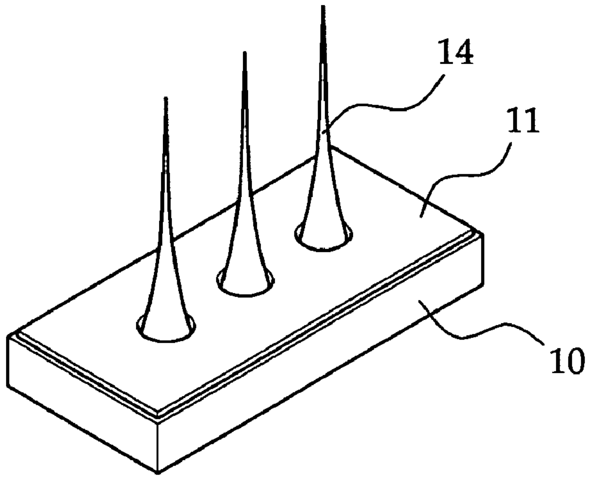
【Figure 14】
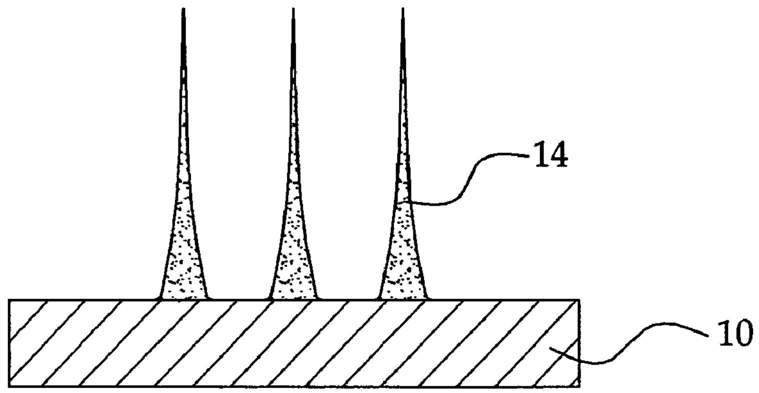
【Figure 15】
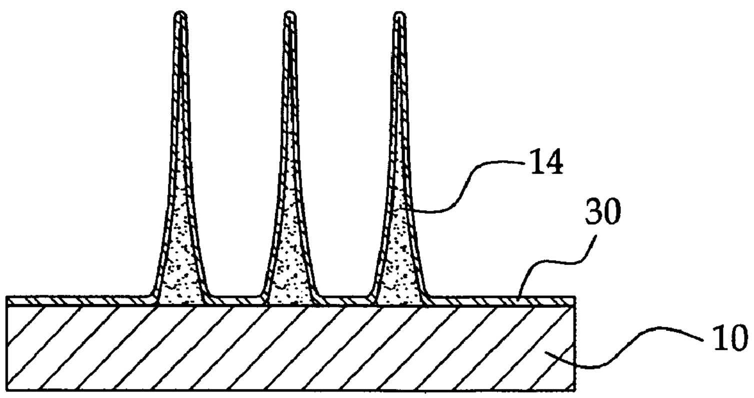

【Figure 16】
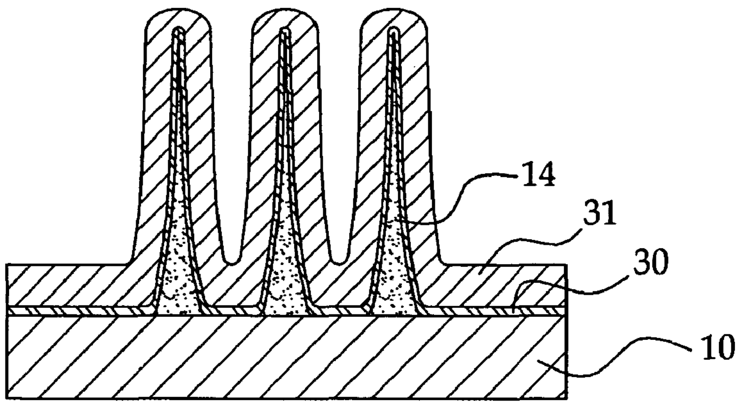
【Figure 17】
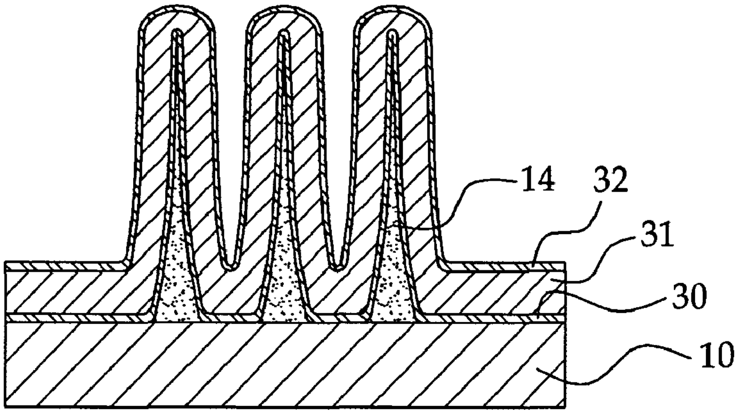
【Figure 18】
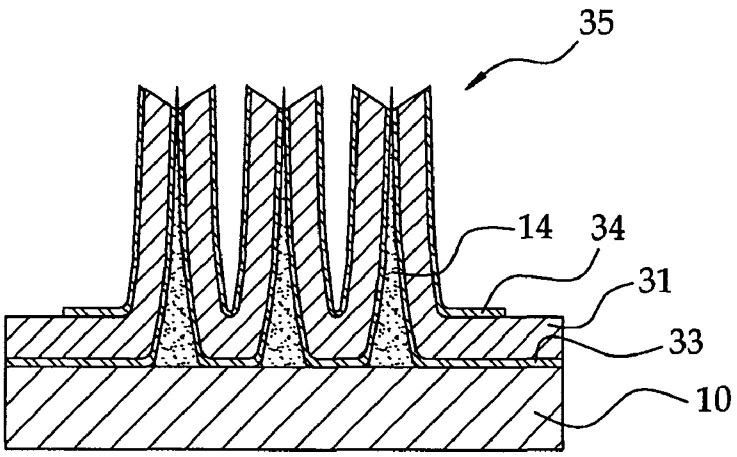

【Figure 19】
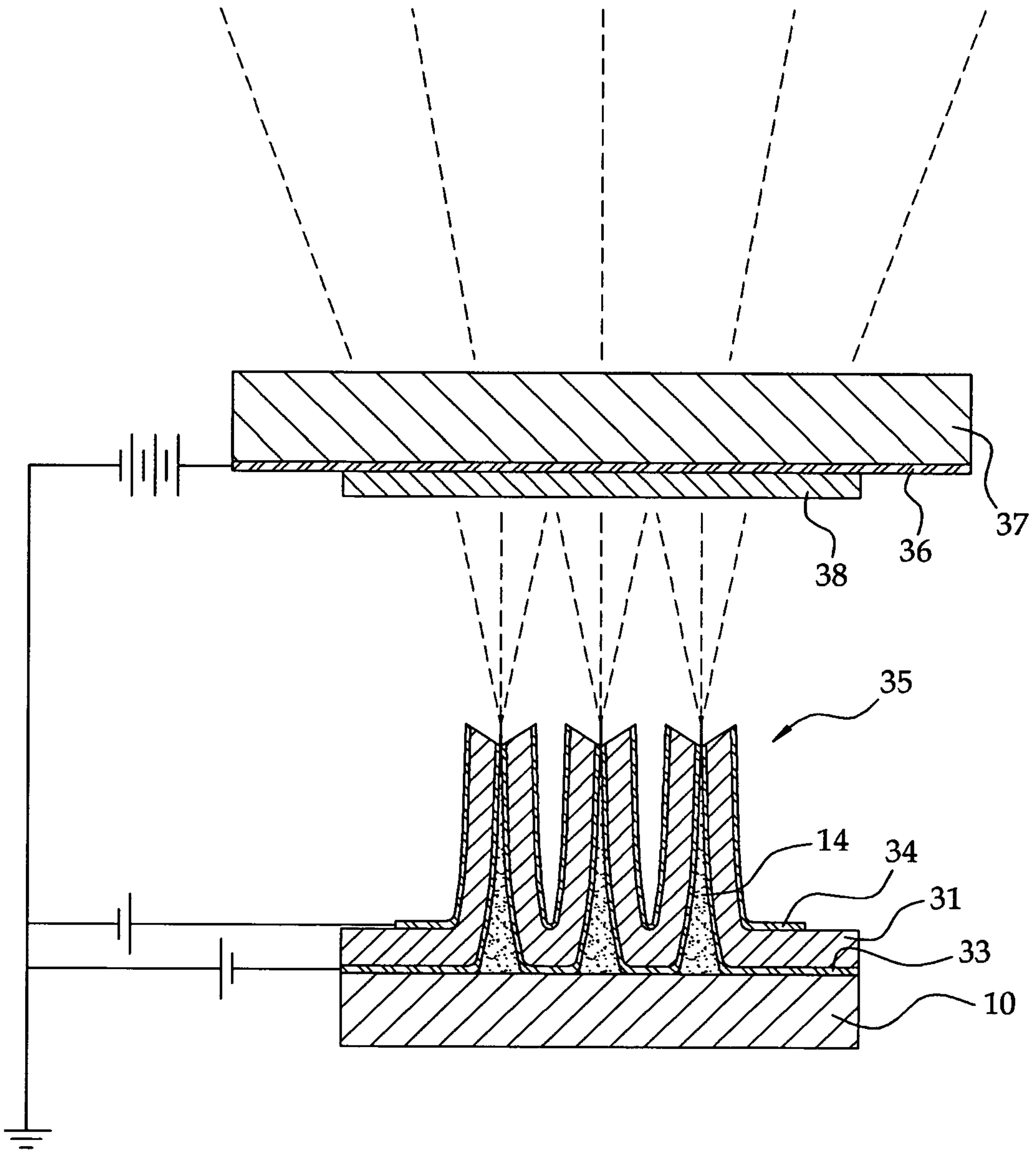

FIELD EMISSION ARRAY HAVING CARBON MICROSTRUCTURE AND METHOD OF MANUFACTURING THE SAME

This is a national phase Application of PCT/KR2008/003874, filed 1 Jul. 2008, claiming priority benefit from KR Application No. 10-2008-0062548, filed 30 Jun. 2008, the entire content of which is hereby incorporated.

TECHNICAL FIELD

The present invention relates to a field emission array and, more particularly, to a field emission array having high-aspect-ratio carbon microstructures used as electron emitters and a method for manufacturing the same.

BACKGROUND ART

A field emission display (FED) refers to a device in which electrons emitted from a cathode panel are irradiated on a fluorescent substance of an anode panel to display an image. The field emission display operates in a similar manner to a cathode ray tube (CRT) but has a flat shape. Just like the cathode ray tube, the field emission display is operated by emission of cathode rays and therefore provides a high light-emitting efficiency, a wide viewing angle, an increased operating speed and a reduced production cost. Among major components of the field emission display are an anode panel and a cathode panel. The anode and cathode panels are spaced apart from each other by a spacer with a vacuum space left therebetween. The anode panel includes a transparent panel, a transparent conductive anode attached to the transparent panel and a fluorescent substance coated on the transparent panel. The cathode panel includes a plurality of field emission arrays (FEA) each having a cathode and an electron emitter. A triode type cathode and a diode type cathode are used as the cathode. The triode type cathode is extensively used in recent years because it has an ability to easily control an emission current with a low voltage and to realize a gray scale with ease.

The electron emitter as a key element of the field emission display is classified into a tip-type and a flat-type. The tip-type electron emitter has a gate hole of reduced diameter and therefore can work at a low voltage. In addition, the tip-type electron emitter is effective in increasing the number of electron emitters within a pixel and increasing the emission current. The tip-type electron emitter is divided into a silicon tip and a metal tip depending on the material thereof. The metal tip is made of a metal such as tungsten, molybdenum or the like and requires a high voltage to emit electrons. Thus, the metal tip suffers from severe dry corrosion, which leads to a problem of shortened lifespan. The silicon tip offers such advantages as ease of shape change, increased homogeneity, and good compatibility with a semiconductor manufacturing process. However, the silicon tip is accompanied by such disadvantages as an unstable emission current, a high risk of damage, presence of an oxide film and limited panel size.

In recent years, attention is paid to an electron emitter made of a carbon material such as diamond, carbon nano tube, diamond-like carbon or unshaped carbon. The carbon material is low in the work function value for determination of an electron emission voltage, exceptionally resistant to corrosion and highly conductive. In particular, the carbon nano tube is advantageous in that electrons are concentrated on the pointed end thereof and can be emitted with ease. Moreover, the carbon nano tube has some features of diamond-based materials. In addition, the carbon nano tube shows a feature of high aspect ratio. If the carbon nano tube is vertically arranged on a substrate, it is possible to greatly increase the electron emission efficiency.

DISCLOSURE

Technical Problem

Although the carbon nano tube exhibits good features for use as an electron emitter, it has a problem in that a difficulty involves in controlling the physical properties thereof and in vertically arranging the same on a substrate through a consistent process. Another problem resides in that the carbon nano tube requires a complex production process and suffers from reduced yield rate. A further problem is that it is difficult to produce the carbon nano tube having an increased surface area.

In view of the problems noted above, it is an object of the present invention to provide a method for manufacturing a field emission array with a carbon microstructure, which is capable of producing carbon microstructures as electron emitters in an easy and cost-effective manner and also capable of manufacturing a field emission array having carbon microstructures arranged upright on a substrate with an increased yield rate. Another object of the present invention is to provide a field emission array with a carbon microstructure, which is manufactured by the above method.

Technical Solution

In one aspect of the present invention, there is provided a method for manufacturing a field emission array with a carbon microstructure, comprising: a photomask attachment step of attaching a photomask with a pattern groove to one surface of a transparent substrate; a photoresist attachment step of attaching a negative photoresist to one surface of the photomask; an exposure step of irradiating light toward the opposite surface of the transparent substrate from the photomask to cure a portion of the negative photoresist with the light irradiated on the negative photoresist through the pattern groove; a developing step of removing an uncured portion of the negative photoresist while leaving the cured-portion of the negative photoresist as a microstructure; a pyrolysis step of heating and carbonizing the microstructure thus obtained; and a cathode attachment step of attaching a voltage-supplying cathode to the surface of the transparent substrate on which the microstructure is formed.

In another aspect of the present invention, there is provided a method for manufacturing a field emission array with a carbon microstructure, comprising: a photomask attachment step of attaching a photomask with a pattern groove to one surface of a transparent substrate; a photoresist attachment step of attaching a negative photoresist to the opposite surface of the transparent substrate from the photomask; an exposure step of irradiating light toward the negative photoresist through the pattern grooves to cure a portion of the negative photoresist; a developing step of removing an uncured portion of the negative photoresist while leaving the cured portion of the negative photoresist as a microstructure; a pyrolysis step of heating and carbonizing the microstructure thus obtained; and a cathode attachment step of attaching a voltage-supplying cathode to the surface of the transparent substrate on which the microstructure is formed.

In a further aspect of the present invention, there is provided a method for manufacturing a field emission array with a carbon microstructure, comprising: a photomask attachment step of attaching a photomask with a pattern groove to one surface of a transparent substrate; a photoresist attachment step of attaching a negative photoresist to one surface of the photomask; an exposure step of irradiating light toward the opposite surface of the transparent substrate from the photomask to cure a portion of the negative photoresist with the light irradiated on the negative photoresist through the pattern groove; a developing step of removing an uncured portion of the negative photoresist while leaving the cured portion of the negative photoresist as a microstructure; a pyrolysis step of heating and carbonizing the microstructure into a carbon microstructure; a photomask removal step of removing the photomask from the transparent substrate; a cathode formation step of attaching a voltage-supplying first transparent electrode to the surface of the transparent substrate on which the carbon microstructure is formed; an insulating film attachment step of attaching an insulating film to the surface of the first transparent electrode; a gate formation step of attaching a voltage-supplying second transparent electrode to the surface of the insulating film; and an etching step of partially removing the first transparent electrode, the insulating film and the second transparent electrode to expose the tip end of the carbon microstructure to the outside.

In a still further aspect of the present invention, there is provided a field emission array with a carbon microstructure manufactured by one of the methods noted above.

Advantageous Effects

With the present invention, it is possible to produce carbon microstructures as electron emitters in an easy and cost-effective manner and to manufacture a field emission array having carbon microstructures arranged upright on a substrate with an increased yield rate. In addition, it is possible to manufacture a field emission array capable of working at a low voltage and prolonging the lifespan of electron emitters.

BRIEF DESCRIPTION OF THE DRAWINGS

FIG. 1 is a diagram of a chromium film or photomask on a glass substrate.

FIG. 2 is a diagram of the chromium film or photomask of FIG. 1 coated with a negative photoresist.

FIG. 3 is a diagram showing the effect of ultraviolet rays irradiated on the opposite surface of the glass substrate of the film or photomask arrangement of FIG. 2.

FIG. 4 is a scanning electron microscope image showing microstructures formed on the glass substrate when the pattern grooves are about 3.0 μm (precisely, 2.97 μ) in diameter and the intensity of the ultraviolet rays irradiated on the glass substrate 10 is 109.2 mJ/cm$^2$.

FIG. 5 is an analysis model showing a representation of a calculated quantity of the energy (or the exposed dose) accumulated in the internal region of the negative photoresist.

FIG. 6 is an illustration showing a representation of the normalized distribution of the accumulated energy quantity calculated by numerical analysis.

FIG. 7 is a scanning electron microscope image showing the microstructures actually produced when the pattern grooves 11*a* are 1.0 μm in diameter and the irradiated energy $D_0$ is 109.2 mJ/cm$^2$.

FIGS. 8 and 9 are scanning electron microscope images showing the microstructures actually produced when the pattern grooves are 1.0 μm in diameter. In FIG. 8, the irradiated energy $D_0$ is 218.4 mJ/cm$^2$. In FIG. 9, the irradiated energy $D_0$ is and 327.6 mJ/cm$^2$.

FIG. 10 is a diagram showing the negative photoresist are removed from the film or photomask arrangement of FIG. 3.

FIG. 11 is a diagram showing a pyrolysis step to reduce the thickness of the microstructures of FIG. 10.

FIG. 12 illustrates the temperature change within the quartz tube furnace during the pyrolysis step of FIG. 11.

FIG. 13 is a diagram showing the microstructures carbonized through the pyrolysis step of FIG. 12 and transformed into carbon microstructures with a reduced thickness.

FIGS. 14 through 18 illustrate the steps in which a cathode and a gate are attached to the glass substrate having the carbon microstructures of FIG. 13.

FIG. 14 is a diagram showing the chromium film is removed from the glass substrate.

FIG. 15 is a diagram showing a first transparent electrode 30 as a cathode to the surface of the substrate.

FIG. 16 is a diagram showing an insulating film attached to the surface of the first transparent electrode.

FIG. 17 is a diagram showing a second transparent electrode serving as a gate attached to the surface of the insulating film.

FIG. 18 is a diagram showing an etching step performed to partially remove the first transparent electrode, the insulating film and the second transparent electrode.

FIG. 19 is a diagram showing a field emission display incorporating the field emission array shown in FIG. 18.

BEST MODE

Hereinafter, a method for manufacturing a field emission array with a carbon microstructure in accordance with one embodiment of the present invention will be described with reference to the accompanying drawings.

The field emission array manufacturing method of the present invention includes a step of producing a plurality of carbon microstructures as electron emitters arranged upright on a transparent substrate and a step of forming a cathode and a gate on the transparent substrate having the upright carbon microstructures.

Referring to FIGS. 1 through 13, the step of producing a plurality of carbon microstructures arranged upright on a transparent substrate is divided into a photolithography step and a pyrolysis step.

FIGS. 1 through 4 show the photolithography step of the present method. As shown in FIG. 1, a chromium film 11 (or a photomask) having a thickness of 1,100 Å is attached to one surface of a glass substrate (or a transparent substrate) (Pyrex #7740, a product of Corning, Inc.) 10 having a thickness of 500 μm. The glass substrate 10 may be changed to many other transparent substrates such as a fused silica substrate and the like.

Similarly, the chromium film 11 may be changed to many other photomasks capable of interrupting light when attached to one surface of a transparent substrate. The chromium film 11 has a plurality of pattern grooves 11*a* arranged at a specified interval, each of the pattern grooves 11*a* having a diameter of 1.0 μm. The chromium film 11 is attached to the glass substrate 10 by an electron-beam deposition method or other like methods. The pattern grooves 11*a* allow light to pass therethrough, the diameter and interval of which may be changed in many different ways. The pattern grooves 11*a* are not limited to the circular shape but may have other shapes. The surface of the glass substrate 10 to which the chromium film 11 is attached serves as a light outgoing surface.

Referring to FIG. 2, after the chromium film 11 has been attached to the glass substrate 10, a negative photoresist 12, e.g., SU-8 (a product of Microchem Inc.), is spin-coated on the surface of the chromium film 11 with a suitable thickness and is then dried. Other kinds of negative photoresists than SU-8 may be attached to the surface of the chromium film 11. Ultraviolet rays (UV) are irradiated on the glass substrate 10 after the negative photoresist 12 has been attached to the chromium film 11.

As shown in FIG. 3, the ultraviolet rays are irradiated on the opposite surface of the glass substrate 10 from the chromium film 11. Then, the ultraviolet rays are incident on the negative photoresist 12 through the pattern grooves 11*a* of the chromium film 11. Although not shown in the drawings, a band-pass filter of 356 nm in wavelength and 10 nm in band width (079-0550 bandpass filter, a product of Opto Sigma Corp.) is arranged between the light source and the glass substrate 10 to filter the ultraviolet rays emitted from the light source. The light used in exposing the negative photoresist 12 is not limited to the ultraviolet rays but may be deep ultraviolet rays, extreme ultraviolet rays, X-rays or other light capable of curing the negative photoresist 12.

The ultraviolet rays projecting toward the glass substrate 10 and passing through the pattern grooves 11*a* of the chromium film 11 are concentrated on the central regions of the pattern grooves 11*a* by diffraction, although some of them are diffused away from the pattern grooves 11*a*. Among the irradiated portions 12*a* of the negative photoresist 12, curing occurs only in the portions 12*b* where the energy quantity of the light is greater than the critical energy value required in curing the negative photoresist 12. Each of the cured portions 12*b* of the negative photoresist 12 is of a conical shape with an increased aspect ratio. The cured portions 12*b* of the negative photoresist 12 constitute microstructures 13. The shape of the microstructures 13 can be changed by adjusting the intensity and irradiation time of the ultraviolet rays and eventually controlling the energy quantity of the light irradiated on the negative photoresist 12. If the energy quantity of the light irradiated on the negative photoresist 12 is increased, the cured portions 12*b* are not thickened but elongated in the light irradiation direction. This is because the light is concentrated on the central regions of the pattern grooves 11*a* by diffraction.

In the exposure step noted above, the photomask, i.e., the chromium film 11, is attached to the surface of the transparent substrate, i.e., the glass substrate 10. This ensures that no light diffraction occurs between the photomask and the transparent substrate in the exposure step. This feature is advantageous in concentrating the light irradiated toward the negative photoresist on the central regions of the pattern grooves 11*a*.

Although the negative photoresist is attached to the surface of the photomask in the illustrated embodiment, it may be attached to the opposite surface of the transparent substrate from the photomask. In this case, the light is projected toward the photomask and is irradiated on the negative photoresist through the transparent substrate.

FIG. 4 is a scanning electron microscope image showing the microstructures 13 formed on the glass substrate 10 when the pattern grooves 11*a* are about 3.0 μm (precisely, 2.97 μm) in diameter and the intensity of the ultraviolet rays irradiated on the glass substrate 10 is 109.2 mJ/cm$^2$. It can be seen in FIG. 4 that each of the microstructures 13 has an aspect ratio of 20 or more and a tip end diameter reduced to about 700 nm (precisely, 697 nm). The shape of the microstructures 13 can be predicted by calculating the quantity of the light energy accumulated in the internal region of the negative photoresist 12.

The quantity of the energy (or the exposed dose) accumulated in the internal region of the negative photoresist 12 can be calculated using the diffraction analysis model shown in FIG. 5 and the following equations regarding the Huygens-Fresnel diffraction principle:

$$U(P_0) = \frac{1}{j\lambda}\int\int_{\Sigma} U(P_1)\frac{\exp(jkr_{01})}{r_{01}}\cos\theta ds \quad (1)$$

$$I(P_0) = \frac{c\varepsilon}{2}|U(P_0)|^2 \quad (2)$$

$$D(P_0, t_{Exp}) = \frac{(1-R_1)I(P_0)t_{Exp}(e^{-\alpha_{Unexp}z} - e^{-\alpha_{Exp}z})}{\alpha_{Exp} - \alpha_{Unexp}} \quad (3)$$

In equations (1) and (2), U is the electric fields induced by the propagation of light, λ is the wavelength of light, c is the speed of light, ∈ is the dielectric constant, $P_0$ is the position in the negative photoresist 12, and $P_1$ is the position of each of the pattern grooves 11*a*. In equation (3), $t_{Exp}$ is the exposure time, $R_1$ is the reflection coefficient between the glass substrate 10 and the negative photoresist 12, z is the projection distance of light from the glass substrate 10, $\alpha_{Exp}$ is the absorption coefficient of the exposed negative photoresist 12, and $\alpha_{Unexp}$ is the absorption coefficient of the unexposed negative photoresist 12.

The distribution of the accumulated energy quantity can be calculated by numerical analysis based on the above equations. FIG. 6 illustrates the normalized distribution of the accumulated energy quantity ($D/D_0$), which is the result of numerical analysis in case where the pattern grooves 11*a* are 1.0 μm in diameter and the irradiated energy $D_0$ is 100 mJ/cm$^2$. In the distribution of the accumulated energy quantity, the critical value Dc of curing energy is represented by the contour line linking the points where the energy is great enough to cure the negative photoresist 12. In this regard, the critical value Dc of curing energy is 50 mJ/cm$^2$. The portion lying inside the contour line is cured because it has an accumulated energy quantity greater than the critical value. The portion lying outside the contour line is removed in the developing step because it has an accumulated energy quantity smaller than the critical value.

FIG. 7 is a scanning electron microscope image showing the microstructures actually produced when the pattern grooves 11*a* are 1.0 μm in diameter and the irradiated energy $D_0$ is 109.2 mJ/cm$^2$. It can be noted in FIG. 7 that the portions of the negative photoresist 12 having an accumulated energy quantity of 63 mJ/cm$^2$ or more were cured. The microstructures 13 thus obtained are 4.6 μm in height. FIGS. 8 and 9 are scanning electron microscope images showing the microstructures 13 actually produced when the pattern grooves 11*a* are 1.0 μm in diameter and the irradiated energy $D_0$ is 218.4 mJ/cm$^2$ and 327.6 mJ/cm$^2$. It can be seen that the microstructures 13 have a height of 7.0 μm when the irradiated energy $D_0$ is 218.4 mJ/cm$^2$ and a height of 10.9 μm when the irradiated energy $D_0$ is 327.6 mJ/cm$^2$. Therefore, it is possible to produce microstructures 13 of desired shape by properly selecting the size of the pattern grooves 11*a* in view of the critical value of curing energy of the negative photoresist 12 and the wavelength of the irradiated light, calculating the shape of the exposure-cured portions of the negative photoresist 12 by numerical analysis, and suitably controlling the energy of the irradiated light.

At the end of the exposure step, the negative photoresist 12 is subjected to a developing step. If the negative photoresist 12 thus exposed is dipped into a developing solution such as a PGMEA solution (a product of Microchem Inc.) for more than one hour, the uncured portions of the negative photoresist 12 are removed and only the cured portions remain as microstructures 13 as shown in FIG. 10. After the developing step, the microstructures 13 are cleansed with a cleaning solution such as isopropyl alcohol, deionized water or the like.

The microstructures 13 produced through the photolithography step is carbonized in a pyrolysis step to reduce the thickness thereof. Referring to FIG. 11, the microstructures 13 are heated to a high temperature within a quartz tube furnace 20 during the pyrolysis step. At this time, the quartz tube furnace 20 is supplied with heat from the outside. A nitrogen gas ($N_2$) is fed into the quartz tube furnace 20 to keep the interior of the quartz tube furnace 20 in a high-temperature inert atmosphere.

FIG. 12 illustrates the temperature change within the quartz tube furnace 20 during the pyrolysis step. The internal temperature of the quartz tube furnace 20 is maintained at 300° C. for a predetermined time period and then increased up to 700° C., after which the quartz tube furnace 20 is cooled. During the time when the internal temperature of the quartz tube furnace 20 is maintained at 300° C. for three hours, the microstructures 13 are dried so that volatile compounds can be evaporated. Thereafter, the internal temperature of the quartz tube furnace 20 is increased up to 700° C. at a rate of 10° C./min and maintained at that temperature for thirty minutes.

During this time, hydrogen and oxygen in the microstructures 13 are decomposed, resulting in reduction in the thickness of the microstructures 13. Subsequently, the quartz tube furnace 20 is naturally cooled in the inert atmosphere. In this way, the microstructures 13 are carbonized through the pyrolysis step and transformed into carbon microstructures 14 with a reduced thickness as shown in FIG. 13. Other furnaces than the quartz tube furnace 20 may be used in heating the microstructures 13 in the pyrolysis step.

FIGS. 14 through 18 illustrate the steps in which a cathode 33 and a gate 34 are attached to the glass substrate 10 having the carbon microstructures 14 arranged upright thereon. As shown in FIG. 14, the chromium film 11 is removed from the glass substrate 10 after the carbon microstructures 14 have been formed upright on the glass substrate 10 through the photolithography step. Then, as illustrated in FIG. 15, a first transparent electrode 30 serving as a cathode 33 is attached to the surface of the glass substrate 10 on which the carbon microstructures 14 are formed. Indium tin oxide (ITO) or other conductive materials may be used as the first transparent electrode 30. The first transparent electrode 30 can be attached to the glass substrate 10 by sputtering, vapor deposition or other methods.

Referring to FIG. 16, an insulating film 31 is attached to the surface of the first transparent electrode 30 after the latter has been attached to the glass substrate 10. Silicon dioxide or other transparent materials may be used as the insulating film 31. Vapor deposition methods such as plasma-enhanced chemical vapor deposition (PECVD) and the like or other attachment methods can be used in attaching the insulating film 31 to the first transparent electrode 30. After attaching the insulating film 31, a second transparent electrode 32 serving as a gate 34 is attached to the surface of the insulating film 31 as illustrated in FIG. 17. Just like the first transparent electrode 30, the second transparent electrode 32 may be made of indium tin oxide (ITO) or other conductive materials.

After attaching the second transparent electrode 32 to the surface of the insulating film 31, an etching step is performed to partially remove the first transparent electrode 30, the insulating film 31 and the second transparent electrode 32 so that the tip ends of the carbon microstructures 14 can be exposed as illustrated in FIG. 18. Owing to the structural feature of the carbon microstructures 14, etching occurs actively near the tip ends of the carbon microstructures 14. This makes it possible to expose the tip ends of the carbon microstructures 14 without having to go through any photolithography step. At the end of the etching step, there is provided a triode type field emission array 35 which includes the cathode 33, the gate 34 and the carbon microstructures 14 serving as electron emitters. The etching step may be omitted if the first transparent electrode 30, the insulating film 31 and the second transparent electrode 32 can be attached or formed in such a manner as not to cover the tip ends of the carbon microstructures 14.

FIG. 19 schematically shows a field emission display incorporating the field emission array 35 shown in FIG. 18. As shown in FIG. 19, a negative voltage is applied to the cathode 33 while a positive voltage of high level is applied to an anode 36 attached to the lower surface of a transparent plate 37. If a positive voltage is applied to the gate 34 so that electric fields can be generated in the carbon microstructures 14, electrons are emitted from the tip ends of the carbon microstructures 14 into the vacuum atmosphere by the tunneling phenomenon under the quantum mechanics. The electrons thus emitted are accelerated toward a fluorescent substance 38 by the anode voltage of even higher level. Light is generated as the accelerated electrons impinge against the fluorescent substance 38. The intensity of the light thus generated is regulated by controlling the positive voltage applied to the gate 34.

While the description made above is directed to the method for manufacturing the triode type field emission array 35, the present invention may find its application in the manufacture of a diode type field emission array. The diode type field emission array can be manufactured by attaching the first transparent electrode 30 as the cathode 33 to the surface of the glass substrate 10 having two carbon microstructures 14 and then partially removing the first transparent electrode 30 through an etching step to expose the tip ends of the carbon microstructures 14. The etching step may be omitted if the first transparent electrode 30 can be attached or formed in such a manner as not to cover the tip ends of the carbon microstructures 14.

With the present invention, it is possible to manufacture the field emission array 35 having the carbon microstructures 14 as electron emitters in an easy and cost-effective manner. In addition, use of high-aspect-ratio carbon microstructures 14 as electron emitters provides a field emission array capable of working at a low voltage and prolonging the lifespan of electron emitters.

The application of the field emission array 35 is not confined to the field emission display but may be expanded to many other light-emitting devices such as a backlight unit of a flat display and the like.

Although one preferred embodiment of the present invention has been described hereinabove, the present invention shall not be limited thereto. It will be understood by those skilled in the art that various changes and modifications may be made without departing from the scope of the invention defined in the claims.

INDUSTRIAL APPLICABILITY

With the present invention, it is possible to manufacture a field emission array having carbon microstructures as electron emitters with increased yield rate. Therefore, the present invention can be advantageously used in the field of field emission displays, backlight units and many other flat display fields.

The invention claimed is:

1. A method for manufacturing a field emission array with a carbon microstructure, comprising:

a photomask attachment step of attaching a photomask with a pattern groove to one surface of a transparent substrate;

a photoresist attachment step of attaching a negative photoresist to one surface of the photomask;

an exposure step of irradiating light toward the opposite surface of the transparent substrate from the photomask to cure a portion of the negative photoresist with the light irradiated on the negative photoresist through the pattern groove;

a developing step of removing an uncured portion of the negative photoresist while leaving the cured portion of the negative photoresist as a microstructure;

a pyrolysis step of heating and carbonizing the microstructure thus obtained; and a cathode attachment step of attaching a voltage-supplying cathode to the surface of the transparent substrate on which the microstructure is formed.

2. The method as recited in claim 1, wherein the accumulated energy quantity of the light irradiated on the negative photoresist is controlled in the exposure step to specify the shape of the microstructure.

3. The method as recited in claim 2, wherein the intensity of the light irradiated on the negative photoresist is adjusted to control the accumulated energy quantity of the light.

4. The method as recited in claim 2, wherein the irradiation time of the light irradiated on the negative photoresist is adjusted to control the accumulated energy quantity of the light.

5. The method as recited in claim 2, further comprising a numerical analysis step of, prior to irradiating the light on the negative photoresist, calculating the shape of the portion of the negative photoresist to be cured by exposure using the equations:

$$U(P_0) = \frac{1}{j\lambda}\int\int_{\Sigma} U(P_1)\frac{\exp(jkr_{01})}{r_{01}}\cos\theta ds,$$

$$I(P_0) = \frac{c\varepsilon}{2}|U(P_0)|^2, \text{ and}$$

$$D(P_0, t_{Exp}) = \frac{(1-R_1)I(P_0)t_{Exp}(e^{-\alpha_{Unexp}z} - e^{-\alpha_{Exp}z})}{\alpha_{Exp} - \alpha_{Unexp}},$$

where U is the electric fields induced by the propagation of light, λ is the wavelength of light, c is the speed of light, ∈ is the dielectric constant, $P_0$ is the position in the negative photoresist, $P_1$ is the position of the pattern groove, $t_{Exp}$ is the exposure time, $R_1$ is the reflection coefficient between the transparent substrate and the negative photoresist, z is the projection distance of light from the transparent substrate, $\alpha_{Exp}$ is the absorption coefficient of the negative photoresist exposed, $\alpha_{Unexp}$ is the absorption coefficient of the negative photoresist unexposed, j is an imaginary number, k is a wave number, $r_{01}$ is a distance from $P_0$ to $P_1$, θ is an angle between vector $r_{01}$ and perpendicular axis, d is delta (term of integral), s is an area, I is an intensity of light, and D is an exposed dose of light energy.

6. The method as recited in claim 1, wherein the cathode attachment step comprises: attaching a first transparent electrode to the surface of the transparent substrate on which the microstructure is formed; and forming the cathode by partially removing the first transparent electrode so that the tip end of the carbon microstructure is exposed to the outside.

7. The method as recited in claim 1, further comprising:

an insulating film attachment step of attaching an insulating film to the surface of the cathode; and a gate attachment step of attaching a voltage-supplying gate to the surface of the insulating film.

8. The method as recited in claim 1, wherein the cathode and the gate are made of indium tin oxide.

9. The method as recited in claim 1, further comprising:

a photomask removal step of removing the photomask from the transparent substrate prior to the cathode attachment step.

10. The method as recited in claim 1, wherein the negative photoresist comprises SU-8 photoresist.

11. The method as recited in claim 1, wherein the pyrolysis step comprises putting the microstructure into a furnace and heating the furnace while feeding a nitrogen gas into the furnace.

12. The method as recited in claim 11, wherein the interior of the furnace is maintained at a first temperature for a first time period to evaporate a volatile compound from the microstructure and then the interior of the furnace is maintained at a second temperature higher than the first temperature for a second time period to carbonize the microstructure.

13. The method as recited in claim 12, wherein the first temperature is about 300° C., the first time period is about three hours, the second temperature is about 700° C., and the second time period is about thirty minutes.

14. A method for manufacturing a field emission array with a carbon microstructure, comprising:

a photomask attachment step of attaching a photomask with a pattern groove to one surface of a transparent substrate;

a photoresist attachment step of attaching a negative photoresist to the opposite surface of the transparent substrate from the photomask;

an exposure step of irradiating light toward the negative photoresist through the pattern groove to cure a portion of the negative photoresist;

a developing step of removing an uncured portion of the negative photoresist while leaving the cured portion of the negative photoresist as a microstructure;

a pyrolysis step of heating and carbonizing the microstructure thus obtained; and a cathode attachment step of attaching a voltage-supplying cathode to the surface of the transparent substrate on which the microstructure is formed.

15. The method as recited in claim 14, wherein the accumulated energy quantity of the light irradiated on the negative photoresist is controlled in the exposure step to specify the shape of the microstructure.

16. The method as recited in claim 14, further comprising:

an insulating film attachment step of attaching an insulating film to the surface of the cathode; and a gate attachment step of attaching a voltage-supplying gate to the surface of the insulating film.

17. A method for manufacturing a field emission array with a carbon microstructure, comprising:

a photomask attachment step of attaching a photomask with a pattern groove to one surface of a transparent substrate;

a photoresist attachment step of attaching a negative photoresist to one surface of the photomask;

an exposure step of irradiating light toward the opposite surface of the transparent substrate from the photomask to cure a portion of the negative photoresist with the light irradiated on the negative photoresist through the pattern groove;

a developing step of removing an uncured portion of the negative photoresist while leaving the cured portion of the negative photoresist as a microstructure;

a pyrolysis step of heating and carbonizing the microstructure into a carbon microstructure;

a photomask removal step of removing the photomask from the transparent substrate;

a cathode formation step of attaching a voltage-supplying first transparent electrode to the surface of the transparent substrate on which the carbon microstructure is formed;

an insulating film attachment step of attaching an insulating film to the surface of the first transparent electrode;

a gate formation step of attaching a voltage-supplying second transparent electrode to the surface of the insulating film; and an etching step of partially removing the first transparent electrode, the insulating film and the second transparent electrode to expose the tip end of the carbon microstructure to the outside.

18. A field emission array with a carbon microstructure manufactured by the method recited in claim 1.

* * * * *